United States Patent
Peng et al.

(10) Patent No.: US 6,548,332 B2
(45) Date of Patent: Apr. 15, 2003

(54) THERMAL TREATMENT PROCESS FOR FORMING THIN FILM TRANSISTORS WITHOUT THE USE OF PLASMA TREATMENT TO FURTHER IMPROVE THE OUTPUT PROPERTY OF THE THIN FILM TRANSISTOR

(75) Inventors: Chih-Yu Peng, Hsinchu (TW); Chia-Sheng Ho, Taichung (TW); Shih-Ming Chen, Sanchung (TW); In-Cha Hsieh, Jubei (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/838,917

(22) Filed: Apr. 20, 2001

(65) Prior Publication Data

US 2002/0048867 A1 Apr. 25, 2002

(30) Foreign Application Priority Data

Jul. 24, 2000 (TW) ........................................ 89114766 A

(51) Int. Cl.⁷ ...................... H01L 21/00; H01L 21/336; H01L 21/331
(52) U.S. Cl. ...................... 438/158; 438/308; 438/378; 438/166
(58) Field of Search ................................ 438/158, 308, 438/378, 166

(56) References Cited

U.S. PATENT DOCUMENTS

| 5,808,316 A | * | 9/1998 | Matsuda et al. |
| 5,959,312 A | * | 9/1999 | Tsai et al. |
| 6,057,896 A | * | 5/2000 | Rho et al. |

* cited by examiner

Primary Examiner—John F. Niebling
Assistant Examiner—Stanetta Isaac
(74) Attorney, Agent, or Firm—Collard & Roe, P.C.

(57) ABSTRACT

A process for forming a thin film transistor includes steps of (a) forming a gate on a portion of a substrate, (b) forming a gate dielectric layer, a semiconductor layer, a source, a drain, and a passivation in order on the substrate, and (c) proceeding a thermal treatment under atmosphere of a specific assistant gas. The specific assistant gas is one selected from a group consisting of hydrogen, steam, inert gases, and gas mixtures thereof. After providing the specific assistant gas during the thermal treatment, the process can improve the output property of the thin film transistor for avoiding double hump phenomenon.

24 Claims, 13 Drawing Sheets

THERMAL TREATMENT PROCESS FOR FORMING THIN FILM TRANSISTORS WITHOUT THE USE OF PLASMA TREATMENT TO FURTHER IMPROVE THE OUTPUT PROPERTY OF THE THIN FILM TRANSISTOR

FIELD OF THE INVENTION

The present invention relates to a process for forming a thin film transistor (TFT), and more particularly to a process for forming a thin film transistor used in a liquid crystal display (LCD).

BACKGROUND OF THE INVENTION

Presently, the traditional picture tube display is gradually replaced because of the hung volume thereof and the radiation. The potential replacer is the liquid crystal display because the advantages of power-saving and easy carrying are achieved by using the liquid crystal display. Therefore, the liquid crystal display becomes the basic equipment for the notebook. Also, the liquid crystal display becomes the main stream of the table directive view plane display for applying to personal computers, video games, and monitors. Therefore, the liquid crystal display will be the leading product in the future.

Generally, most liquid crystal displays are manufactured by using the thin film transistors as driving devices, so that the output property of the thin film transistor affects the performance of the liquid crystal display mostly. Therefore, it is indeed an important issue to improve the process and the property of the thin film transistor.

FIGS. 1A–1E are schematic sectional views illustrating a method for forming a thin film transistor according to the prior art. As shown in FIG. 1A, a gate 11a is formed on a substrate 10 by two steps: (1) forming a conducting layer on the substrate 10, and (2) removing the conducting layer which is not located at the gate region by photolithography and etching for forming the gate 11a. Sequentially, a gate dielectric layer 12 and an amorphous silicon layer 13 are in order formed on the gate 11a and the amorphous silicon layer 13 is further formed into an amorphous silicon island as shown in FIG. 1B by photolithography and etching. Then, a doped amorphous silicon layer 15 and a metal layer 16 are in order formed on the gate dielectric layer 12, as is shown in FIG. 1C.

Referring to FIG. 1D, portions of the doped amorphous silicon layer 15 and the metal layer 16 are removed by photolithography and etching for forming a source 15a, a drain 15b, a source electrode 16a, and a drain electrode 16b, respectively. Sequentially, a passivation 17 is formed on portions of the gate dielectric layer 12 and the amorphous silicon island 13, the source electrode 16a, and the drain electrode 16b. The passivation 17 located on the drain electrode 16b is partially removed to form a contact window 19. Then, a transparent conducting later 18 is formed in the contact window 19 and on the passivation 17. After photolithography and etching, a pixel electrode 18a is formed as shown in FIG. 1E. Finally, after an annealing step for stabilizing the structure and modifying the crystallization and interface property thereof, the finished traditional structure of the thin film transistor is formed.

During the period of etching the doped amorphous silicon layer 15 and the metal layer 16, a portion of amorphous silicon layer 13 is also etched, which causes the amorphous silicon layer 13 becomes thinner. Thus, an etching stop layer whose composition is silicon nitride is generally formed on the amorphous silicon layer 13 by a plasma enhanced chemical vapor deposition (PECVD) for forming an etching stop thin film transistor. FIGS. 2A–2F illustrate a method for forming the etching stop thin film transistor according to the prior art. First of all, a gate 11a is formed on a substrate 10 as shown in FIG. 2A. Sequentially, a gate dielectric layer 12, an amorphous silicon layer 13, and an insulating layer 14 which is a silicon nitride are in order formed on the substrate 10 and the gate 11a (see FIG. 2B). Then, a portion of insulating layer 14 is removed by photolithography and etching for forming the etching stop layer 14a as shown in FIG. 2C. Sequentially, as shown in FIG. 2D, a doped amorphous silicon layer 15 and a metal layer 16 are in order formed on the amorphous silicon layer 13 and the etching stop layer 14a.

FIG. 2E illustrates that portions of the amorphous silicon layer 13, the doped amorphous silicon layer 15, and the metal layer 16 are removed by photolithography and etching for forming a source 15a, a drain 15b, a source electrode 16a, and a drain electrode 16b. In this step, the amorphous silicon layer 13 is protected from etching owing to the etching stop layer 14a. Then, a passivation 17 is formed on portions of the gate dielectric layer 12, the etching stop layer 14a, the source electrode 16a, and the drain electrode 16b. Sequentially, the passivation 17 located on the drain electrode 16b is partially removed to form a contact window. Then, a transparent conducting layer is formed in the contact window and on the passivation 17. After photolithography and etching, a pixel electrode 18a is formed as shown in FIG. 2F. Finally, after an annealing step for stabilizing structure and modifying the crystallization and interface property thereof, a finished traditional structure of etching stop thin film transistor is formed.

However, the source 15a and the drain 15b are locates on the opposite side of the etching stop layer 14a, so that they can be a switch of the amorphous silicon layer 13 for generating the effect of a parasitic transistor. The effect of parasitic transistor results in a double hump phenomenon in the output property plot of the thin film transistor as shown in FIG. 3. FIG. 3 is a diagram illustrating the relation between the gate voltage and the drain current. When the gate of thin film transistor is applied a voltage, the current passing through the drain has a two-staged change in the linear region, or even a three-staged change called the triple hump phenomenon. Thus, it is impossible to clearly define the switch status, i.e. "on" or "off", of the thin film transistor, which is a serious defect of the thin film transistor as a driving device. In addition, while the interface properties of the etching stop layer 14a and those of the amorphous silicon layer 13 are not matched, or the device is damaged by plasma during etching the doped amorphous silicon layer 15 and the insulating layer 14, the problems of increasing the closing current, increasing the threshold voltage, decreasing the sub-threshold swing are occurred.

Currently, some methods have been developed for the thin film transistor to avoid the above undesired properties. One is that after forming the structure of the gate, the amorphous silicon layer, the source and the drain, the structure is treated by plasma before forming the passivation and the pixel electrode. Another is that after forming the amorphous silicon layer, the structure is treated by a first plasma treatment which infuses the decomposed ion into the amorphous silicon layer by a high energy plasma for filling the dangling bond. The other is similar with the previous one except after forming the passivation and the conducting electrode, the thin film transistor is treated by a $H_2O$ plasma.

However, it is not only cost but also decreasing yield because of adding one or two steps of plasma treatment. In addition, the distribution of the plasma naturally cannot even, so it is hard to control in the large area process.

Besides the etching stop thin film transistor, the back channel etched thin film transistor is another general type. The process for producing the back channel etched thin film transistor is the same as that of the etching stop thin film transistor shown in FIGS. 1A–1E. After forming the source 15a and the drain 15b, the amorphous silicon layer 13 is exposed to the passivation 17. The exposed portion of the amorphous layer 13 will produce the interface defect because of the plasma erosion or the different silicon composition of the passivation 17. Thus, if the interface status is controlled improperly, the bad output property of the thin film transistor could be caused, and the photocurrent produced by illumination without applying a voltage to the gate could be increased.

Therefore, the purpose of the present invention is to develop a method to deal with the above situations encountered in the prior art.

SUMMARY OF THE INVENTION

It is therefore an object of the present invention to propose a process for forming a thin film transistor without a plasma treatment to improve the output property of the thin film transistor.

It is therefore another object of the present invention to propose a process for improving output property of a thin film transistor without a plasma treatment to reduce the cost and time of production.

According to the present invention, the process for forming a thin film transistor comprises steps of (a) forming a gate on a portion of a substrate, (b) forming a gate dielectric layer on the gate and the substrate, (c) forming a semiconductor layer on the gate dielectric layer, (d) defining a source and a drain on the semiconductor layer, (e) forming a passivation on the source, the drain, and the semiconductor layer, and (f) proceeding a thermal treatment under atmosphere of a specific assistant gas.

Certainly, the substrate can be a transparent substrate. The transparent substrate is preferably a glass substrate. The gate is one of a polysilicon and a metal. The gate dielectric layer is a silicon nitride layer.

Certainly, the semiconductor layer can be an amorphous silicon layer or an amorphous silicon layer forming thereon an etching stop layer. The etching stop layer can be a silicon nitride layer. The silicon nitride layer is formed by a plasma enhanced chemical vapor deposition.

Certainly, the source and the drain can be formed by one of an ion implantation and a plasma enhanced chemical vapor deposition.

Certainly, the passivation can be a silicon nitride layer.

Certainly, the specific assistant gas can be one selected from a group consisting of hydrogen, steam, inert gases, and gas mixtures thereof. When the specific assistant gas is hydrogen, the thermal treatment is performed at a temperature ranged from 200 to 300° C. When the specific assistant gas is one selected from a gas mixture of steam and argon and a gas mixture of steam and nitrogen, and the steam has a volume ratio ranged from 20 to 100%, the thermal treatment is performed at a temperature ranged from 80 to 300° C. When the specific assistant a gas mixture of hydrogen and nitrogen, and the hydrogen has a volume ratio ranged from 20 to 100%, the thermal treatment is performed a temperature ranged from 200 to 300° C.

Certainly, the thermal treatment can have a treating time ranged from 10 minutes to 10 hours. The thermal treatment can be proceeded at atmosphere or at decompression ranged from 1 to 750 torr.

According to another aspect of the present invention, a process for improving a thin film transistor property, wherein the thin film transistor includes a substrate, a gate, a semiconductor layer, a source, a drain, and a passivation, comprises steps of providing a specific assistant gas which is selected from a group consisting of hydrogen, steam, inert gases, and gas mixtures thereof, and proceeding a thermal treatment with the thin film transistor at atmosphere of the assistant gas.

According to an additional aspect of the present invention, the process for producing a thin film transistor of a liquid crystal display includes steps of (a) forming a gate on a portion of a transparent substrate, (b) forming a gate dielectric layer on the gate and the substrate, (c) forming a semiconductor layer on the gate dielectric layer, (d) defining a source and a drain on the semiconductor layer, (e) forming a passivation on the source, the drain, and the semiconductor layer, (f) removing a portion of the passivation on the source and the drain for forming a contact window, (g) forming a conducting electrode in the contact window, and (h) proceeding a thermal treatment under atmosphere of a specific assistant gas.

Certainly, the step (f) can be preformed by a dry etching. The step (g) can further comprise steps of (g1) forming a conducting layer in the contact window and on the passivation, and (g2) removing the conducting layer on the passivation for forming the conducting electrode.

Certainly, the conducting layer can be a transparent conducting layer. The transparent conducting layer is preferably an indium-tin oxide layer.

The present invention may best be understood through the following description with reference to the accompanying drawings, in which:

DETAILED DESCRIPTION OF THE PREFERRED EMBODIMENTS

The present invention discloses an improved process for forming a thin film transistor.

Figure 1A:
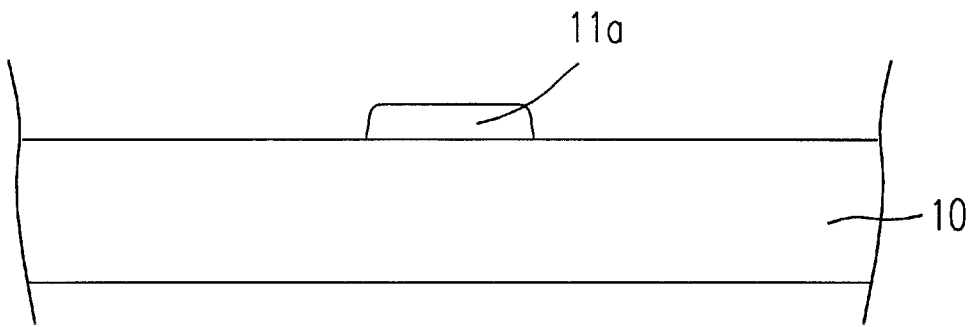
FIGS. 1A–1E are schematic sectional views illustrating a method for forming a thin film transistor according to the prior art.
Figure 1B:
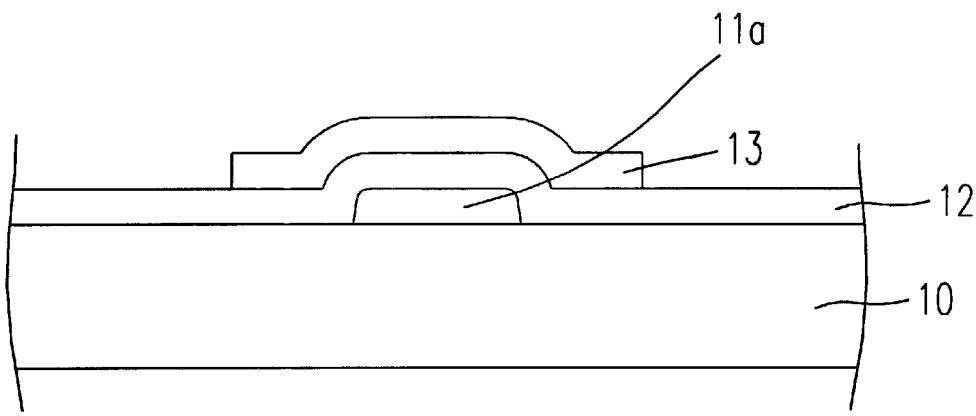
Figure 1C:
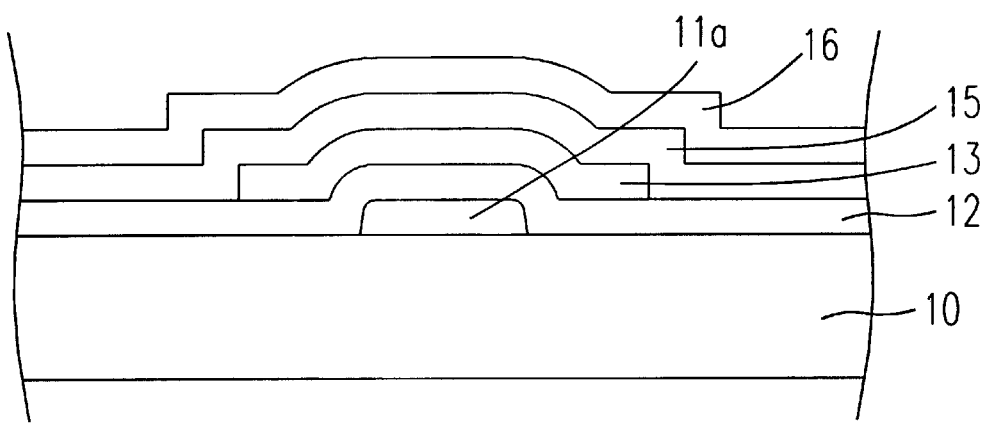
Figure 1D:
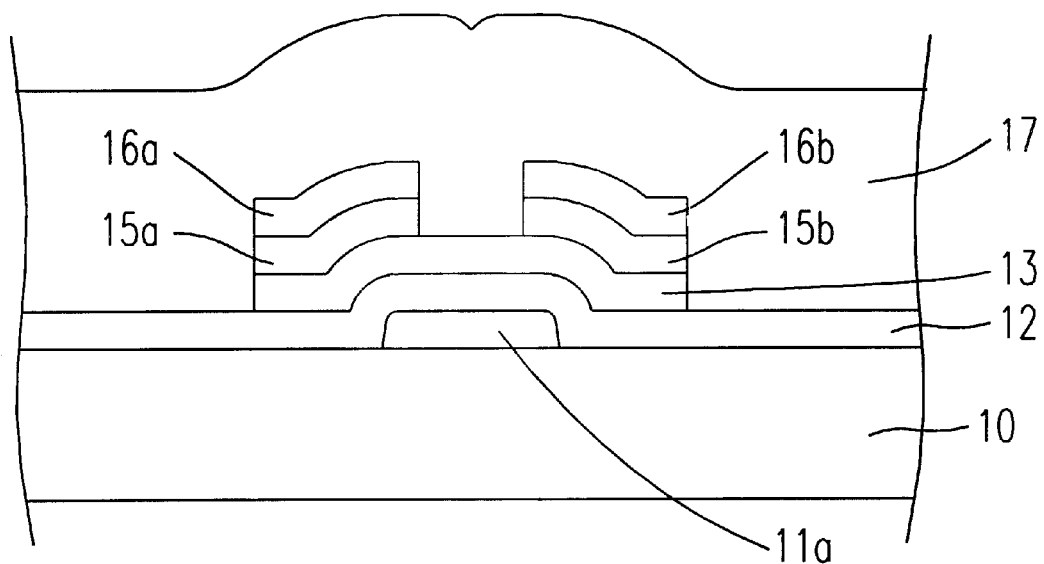
Figure 1E:
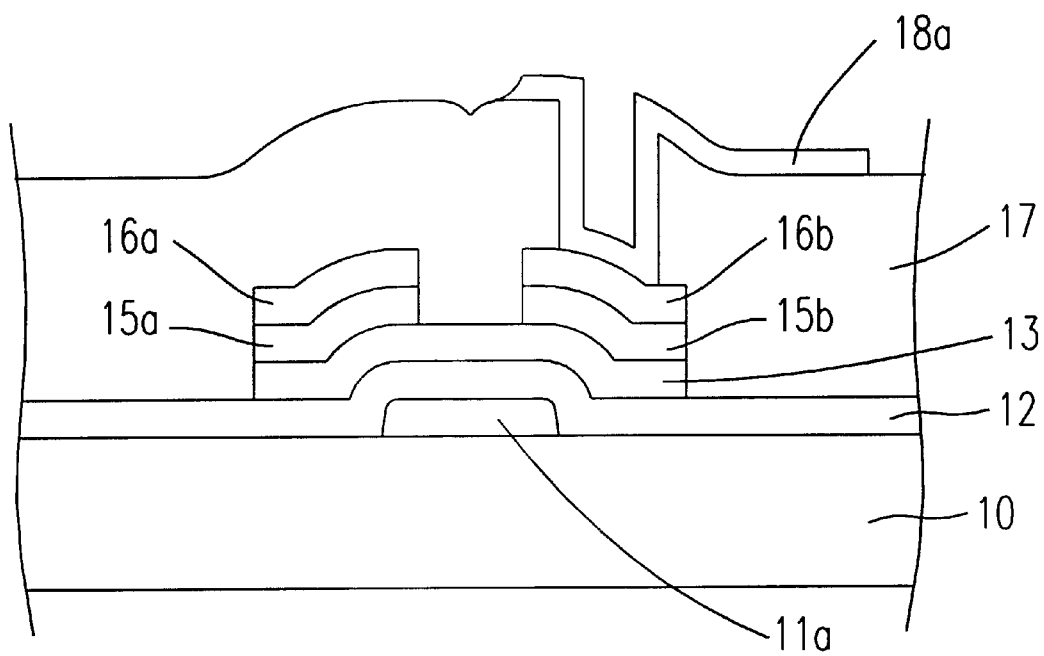
Figure 2A:
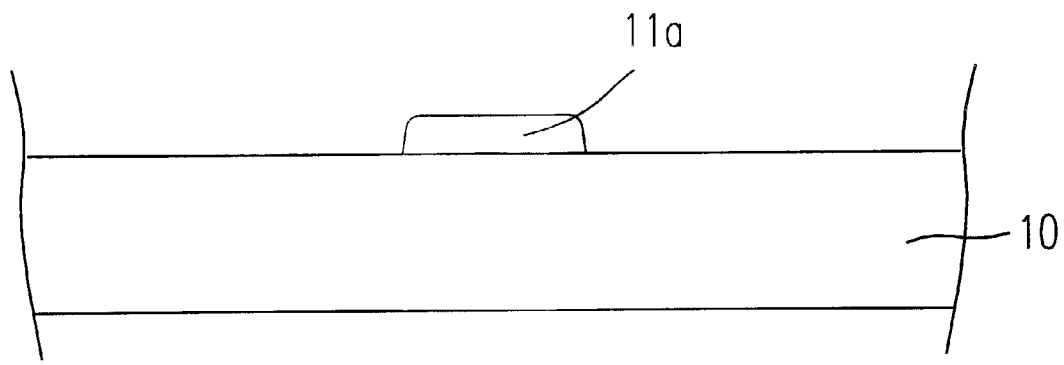
FIGS. 2A–2F are schematic sectional views illustrating a method for forming an etching stop thin film transistor according to the prior art.
Figure 2B:
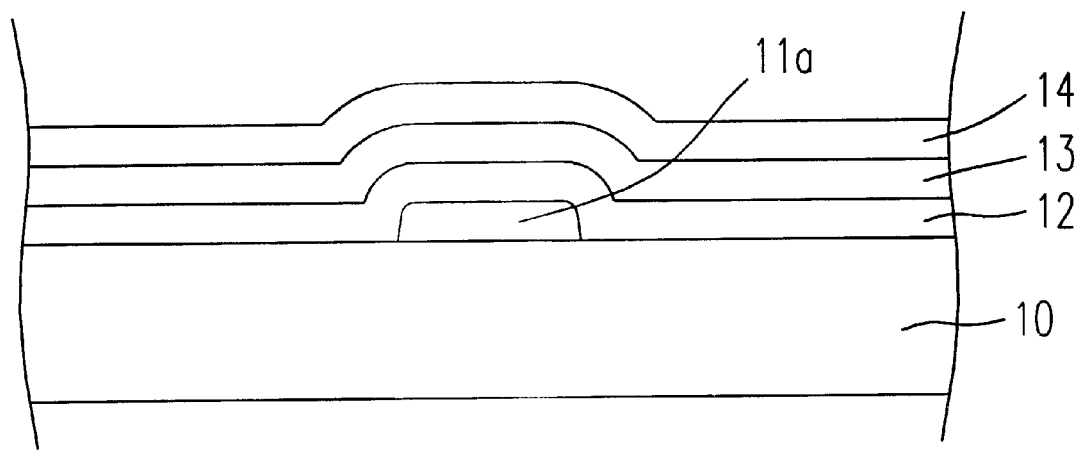
Figure 2C:
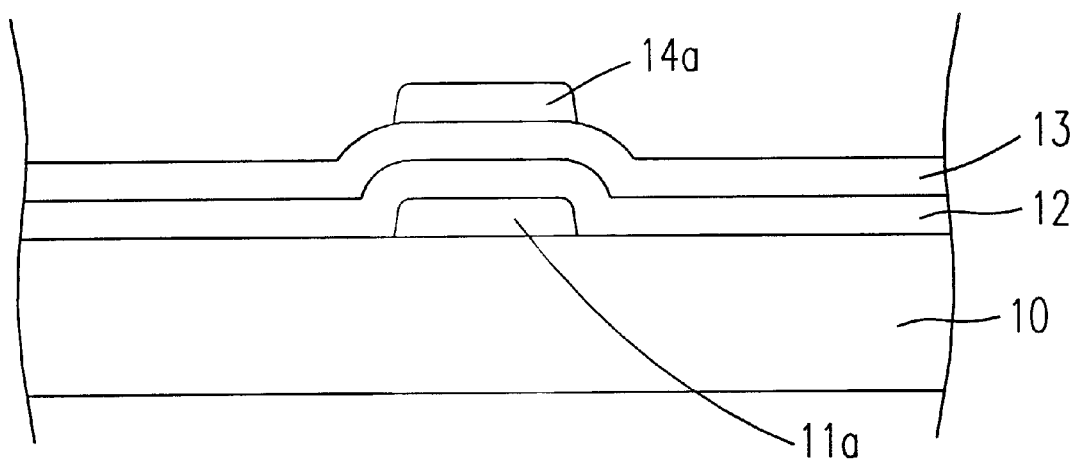
Figure 2D:
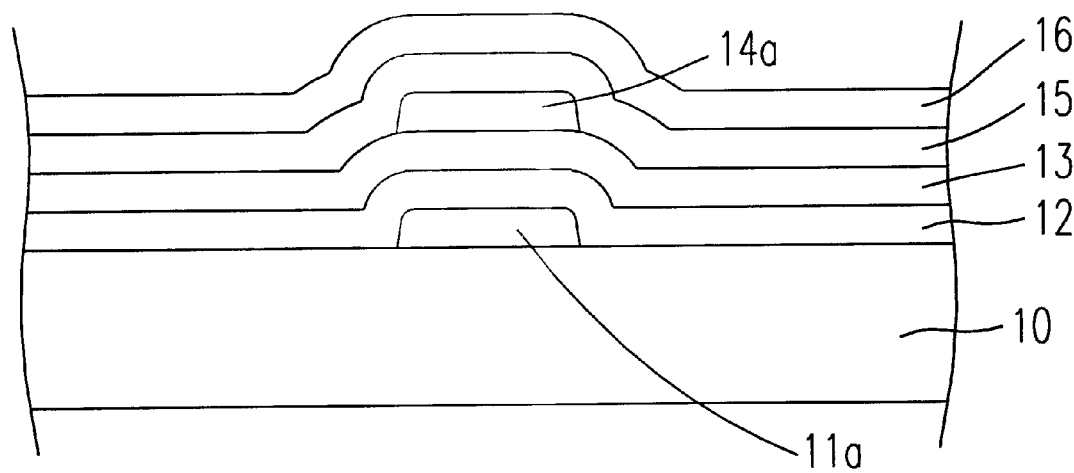
Figure 2E:
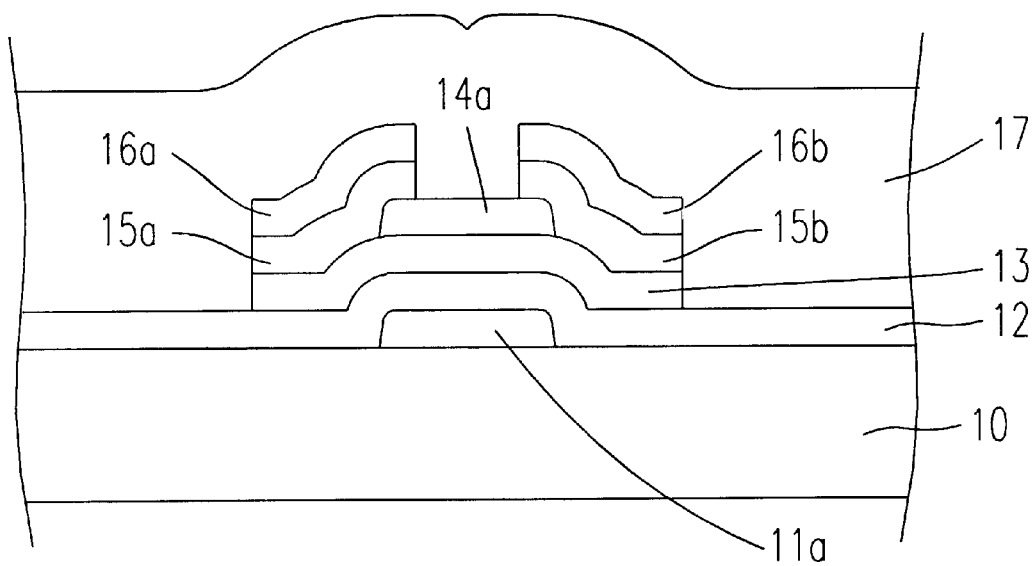
Figure 2F:
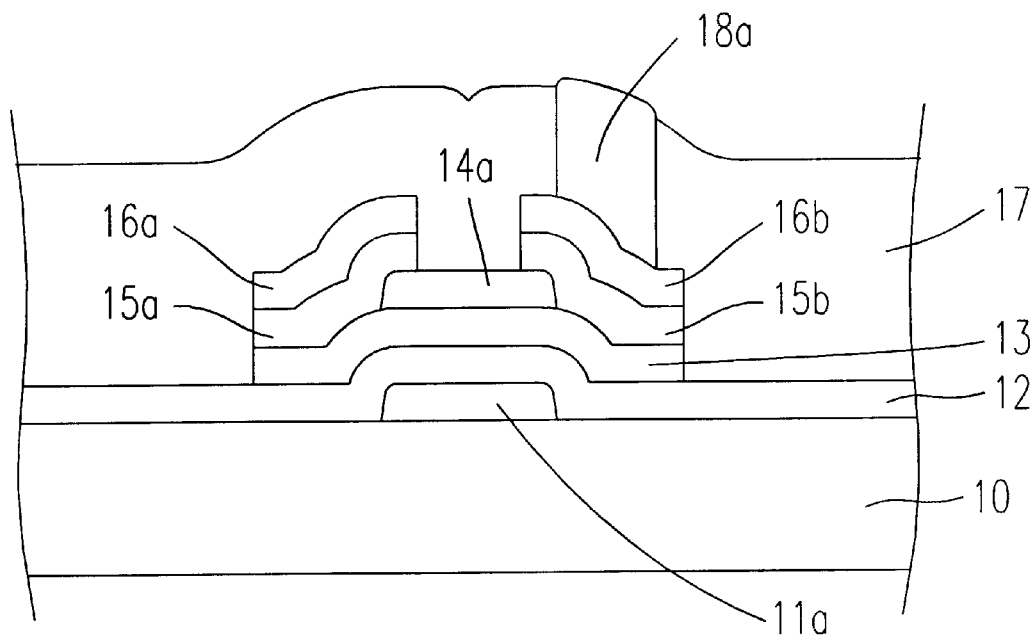
Figure 3:
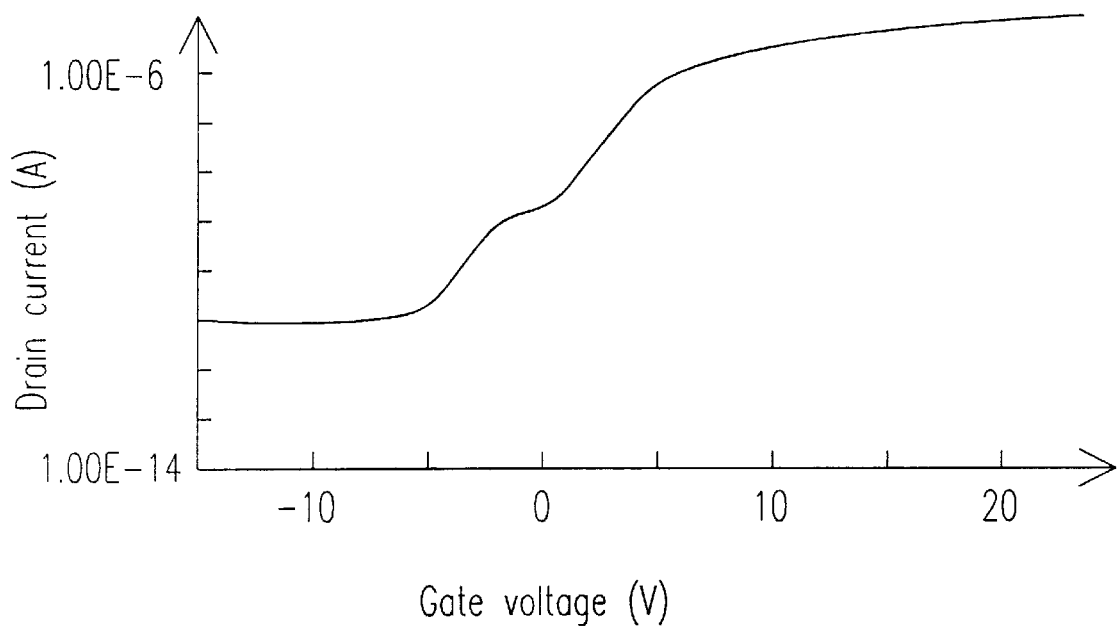
FIG. 3 is a plot illustrating the relation between the drain current and the applied gate voltage of the etching stop thin film transistor according to the prior art.
Figure 4A:
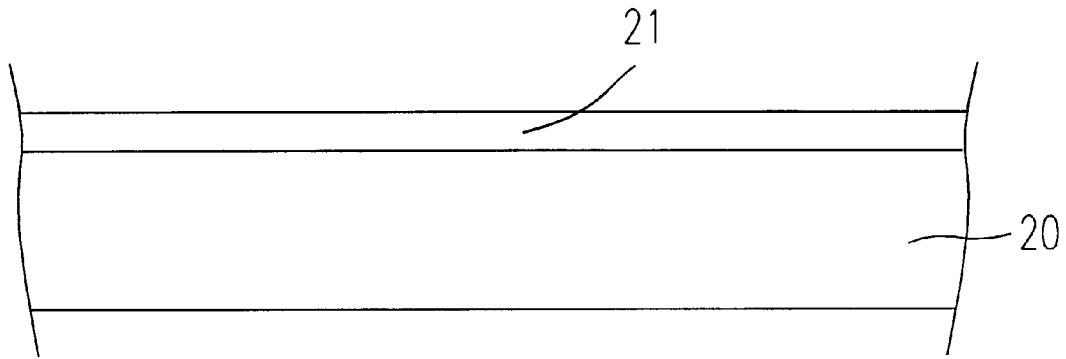
FIGS. 4A–4F are schematic sectional view illustrating a method for forming an etching stop thin film transistor according to the present invention.

FIGS. 4A–4F are schematic sectional view illustrating the major steps for forming an etching stop thin film transistor according to the present invention. As shown in FIG. 4A, a conducting layer 21 is formed on a substrate 20. If the thin film transistor is used to be a driving device for controlling a liquid crystal display, the substrate 20 is made of a transparent material such as glass. The conducting layer 21 can be made of chromium (Cr), molybdenum (Mo), titanium (Ti), aluminum (Al), or aluminum alloy by sputtering. In addition, the conducting layer 21 can be made of polysilicon by a chemical vapor deposition.

Figure 4B:
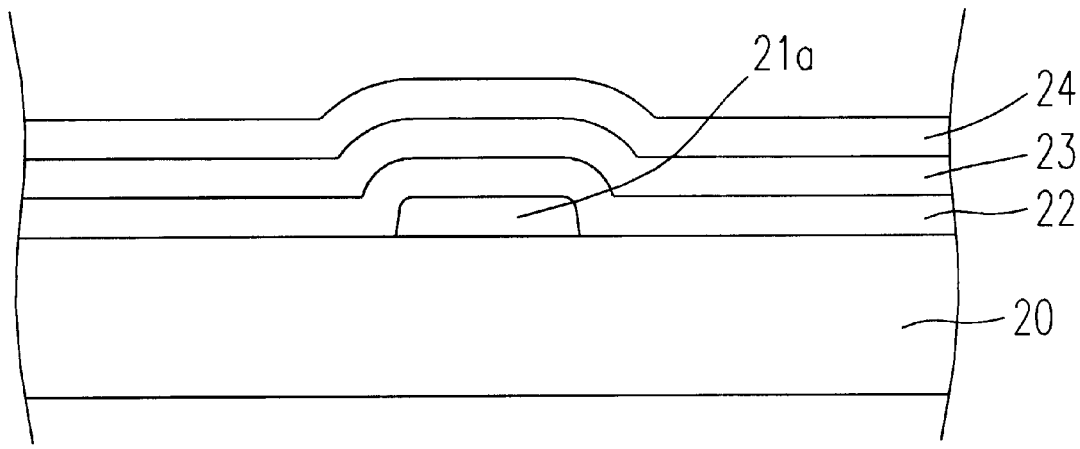

As shown in FIG. 4B, first, a gate region is defined by photolithography. Second, a portion of the conducting layer 21, which is not located at the gate region, is removed by etching, and the remained conducting layer 21 is formed into a gate 21a. Subsequently, a gate dielectric layer 22, an amorphous silicon 23, and an insulating layer 24 are in order formed on the substrate 20 and the gate 21a. Generally, the gate dielectric layer 22 is silicon nitride, or especially a silicon dioxide/silicon nitride composite formed by plasma enhanced chemical vapor deposition (PECVD). Also, the amorphous silicon 23 is formed by plasma enhanced chemical vapor deposition. The insulating layer 24 is generally made of a silicon nitride formed by plasma enhanced chemical vapor deposition.

Figure 4C:
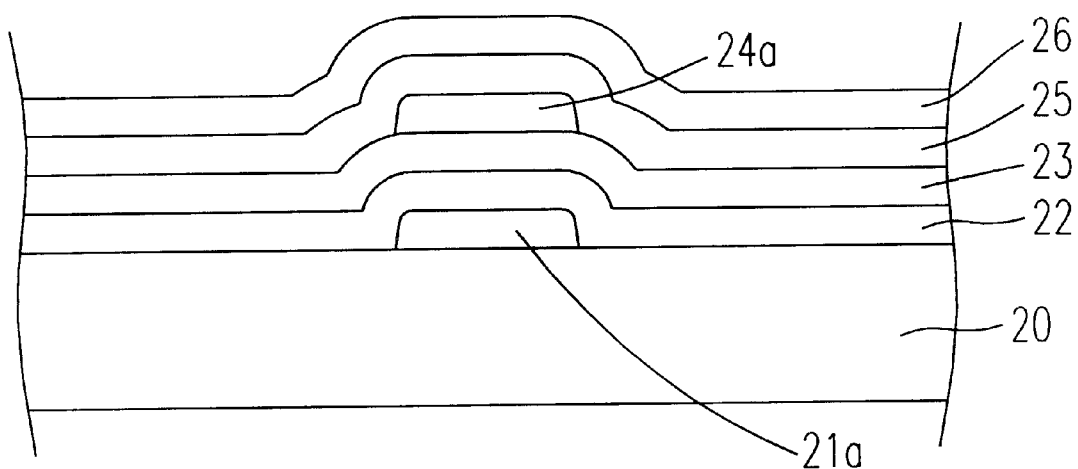

Subsequently, as shown in FIG. 4C, an etching stop region is defined by photolithography and a portion of the insulating layer 24, which is not located at the etching stop region, is removed by etching, and the remained insulating layer 24 is formed into an etching stop layer 24a. The etching stop layer 24a is located on the gate 21a, and the size of the etching stop layer 24a somewhat smaller than that of the gate 21a. Sequentially, a doped amorphous silicon layer 25 and a metal layer 26 are in order formed on the amorphous silicon layer 23 and the etching stop layer 24a. The doped amorphous silicon layer 25 can be formed by deposition, or by depositing an amorphous silicon and then implanting an ion such as $P^+$ and $As^+$. The metal layer 26 which is made of Cr, Mo, Ti, Al, or aluminum alloy is formed by sputtering.

Figure 4D:
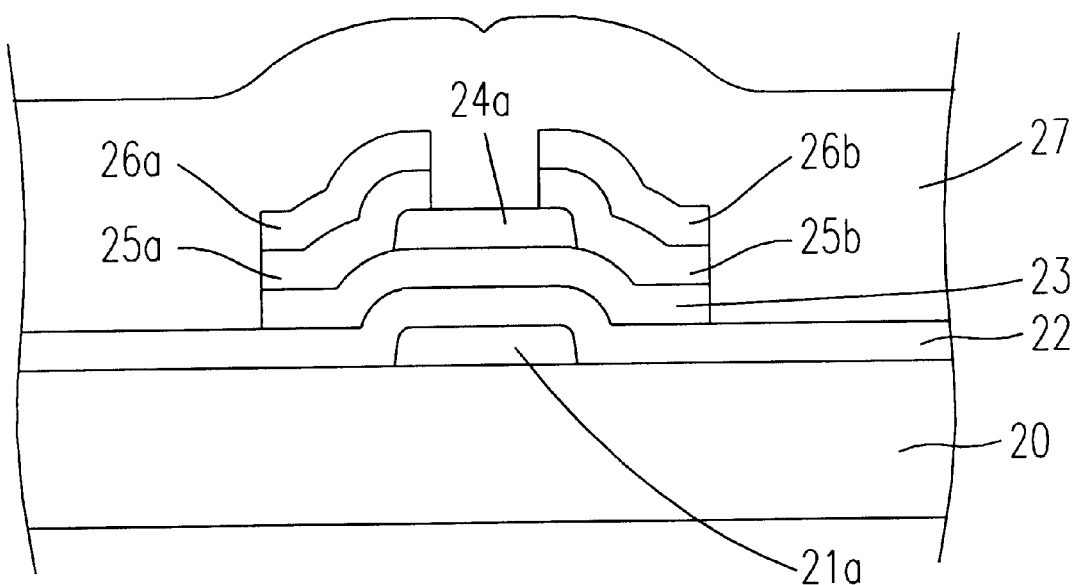

As shown in FIG. 4D, a source and drain region is defined by photolithography, and a portion of the doped amorphous silicon layer 25 and the metal layer 26 which is not located at the source and drain region are removed by etching; thus, the remained doped amorphous silicon layer is formed into a source 25a and a drain 25b, and the remained metal layer is formed into a source electrode 26a and a drain electrode 26b. Sequentially, a passivation 27 is formed on the amorphous silicon layer 23, the source electrode 26a and the drain electrode 26b. The passivation 27 can be silicon nitride and formed by the plasma enhanced chemical vapor deposition.

Figure 4E:
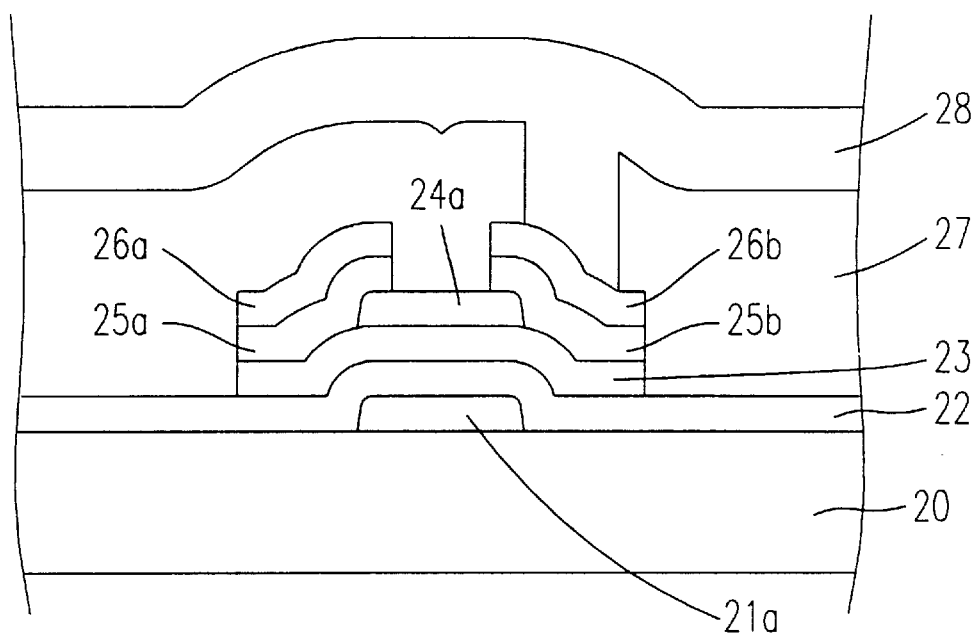

Subsequently, a contact window region is defined by photolithography, and the passivation 27 located on the drain electrode 26b is removed by etching to form a contact window 29 as shown in FIG. 4E. Then, a transparent conducting layer 28 is formed in the contact window 29 and on the passivation 27. Generally, the transparent conducting layer 28 is made of indium-tin oxide (ITO) which is capable of conducting electricity and can be pass through by visible light, and is formed by a physical vapor deposition, e.g. sputtering.

Figure 4F:
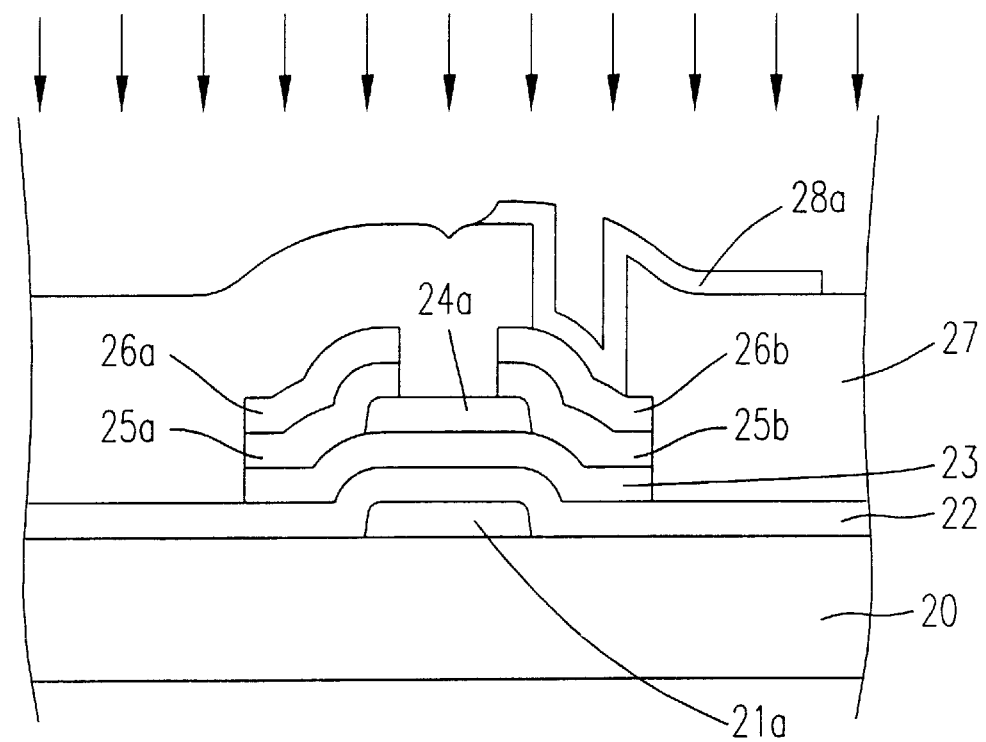

As shown in FIG. 4F, a portion of the transparent conducting layer 28 located on the passivation 27 is removed by photolithography and etching, then the remained transparent conducting layer is formed into a pixel electrode 28a. Finally, it is important to use a thermal treatment, e.g. an annealing step, for increasing the stability of the amorphous silicon layer, improving the contacting property of the source and the drain, enhancing the crystallization and the visible-light transmittance of the transparent conducting material, and decreasing the resistance of the transparent conducting material, etc. The temperature of the thermal treatment ranges from 80 to 300° C., and the time of the thermal treatment ranges from 10 minutes to 10 hours. The exact temperature and time of the thermal treatment is dependent on the requirement of the process. The characteristic of the present invention is to provide a specific assistant gas, such as hydrogen, steam, or a gas mixture of hydrogen and nitrogen (the percentage of hydrogen is 20 to 100%), during the period of thermal treatment. Hence, it is not necessary to treat the device by plasma before or after forming the passivation. Therefore, not only the total time spent on producing the thin film transistor can be shortened, but also the output property of the thin film transistor can be improved for solving the problems of double hump, high closing current, and small sub-threshold swing.

Three embodiments of using different assistant gases under different thermal treatment conditions are described as follows.

Figure 5:
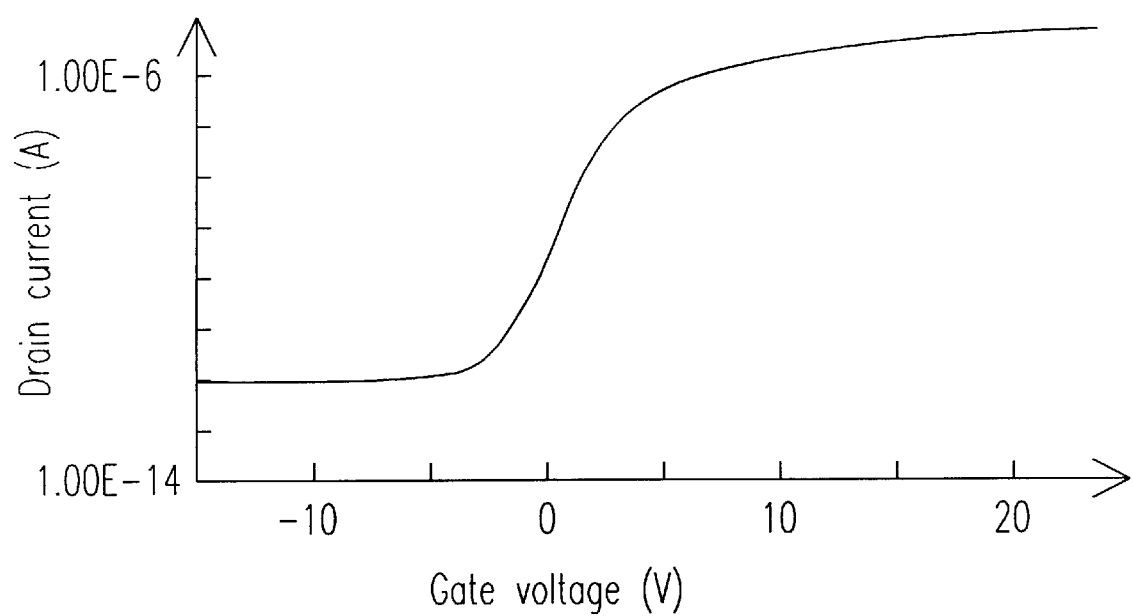
FIG. 5 is a plot illustrating the relation between the drain current and the applied gate voltage of the thin film transistor treated by steam according to the present invention.

In the first embodiment, a steam is provided during an annealing step at 200° C. for 60 minutes. The relation between the drain current and the applied gate voltage of the thin film transistor for the first embodiment is shown as FIG. 5. Referrin to FIG. 5, no double hump phenomenon is shown, the closing current decreases to $10^{-12}$ Ampere, and the sub-threshold swing increases.

Figure 6:
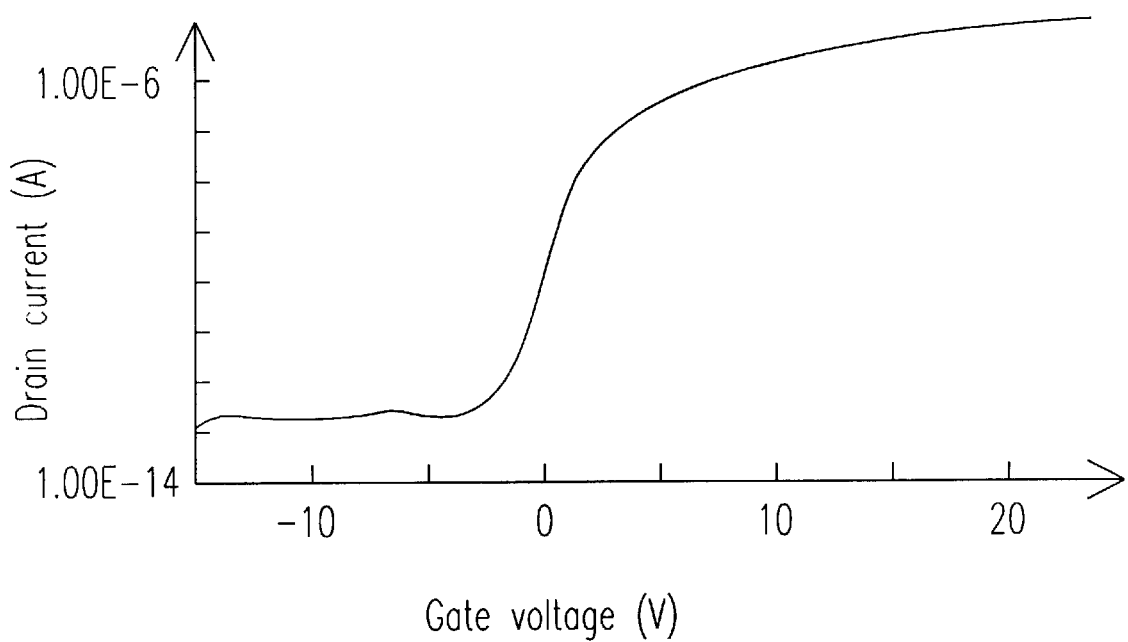
FIG. 6 is a plot illustrating the relation between the drain current and the applied gate voltage of the thin film transistor treated by hydrogen according to the present invention.
Figure 7:
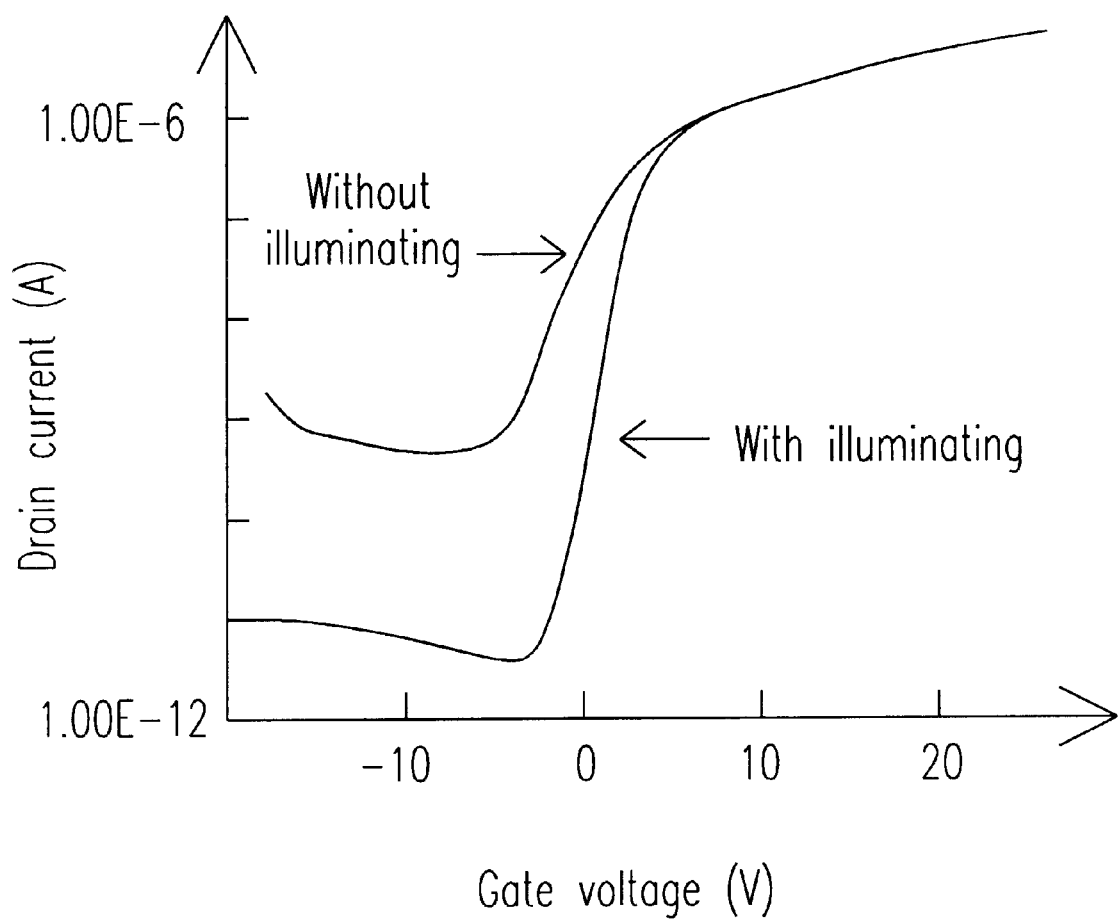
FIG. 7 is a plot illustrating the relation between the drain current and the applied gate voltage of the thin film transistor treated by hydrogen with and without illumination according to the present invention.

In the second, a hydrogen is provided during the annealing step at 250° C. for 20 minutes. The relation between the drain current and the applied gate voltage of the thin film transistor for the second embodiment is shown as FIG. 6. Referring to FIG. 6, no double hump phenomenon is shown, the closing current decreases to $10^{-13}$ Ampere, and the sub-threshold swing increases. FIG. 7 is the relation between the drain current and the applied gate voltage of the thin film transistor for the second embodiment with/without illuminating treatment. After be subjected to illuminating, the closing current is inhibited to $10^{-11}$ Ampere. However, generally the closing current of the thin film transistor without plasma treatment is $10^{-10}$ Ampere after illuminating, and after hydrogen plasma treatment, the closing current of the thin film transistor can be inhibited to $10^{-11}$ A (data not shown). Therefore, the present invention has the similar effect of the plasma treatment on the thin film transistor.

Figure 8:
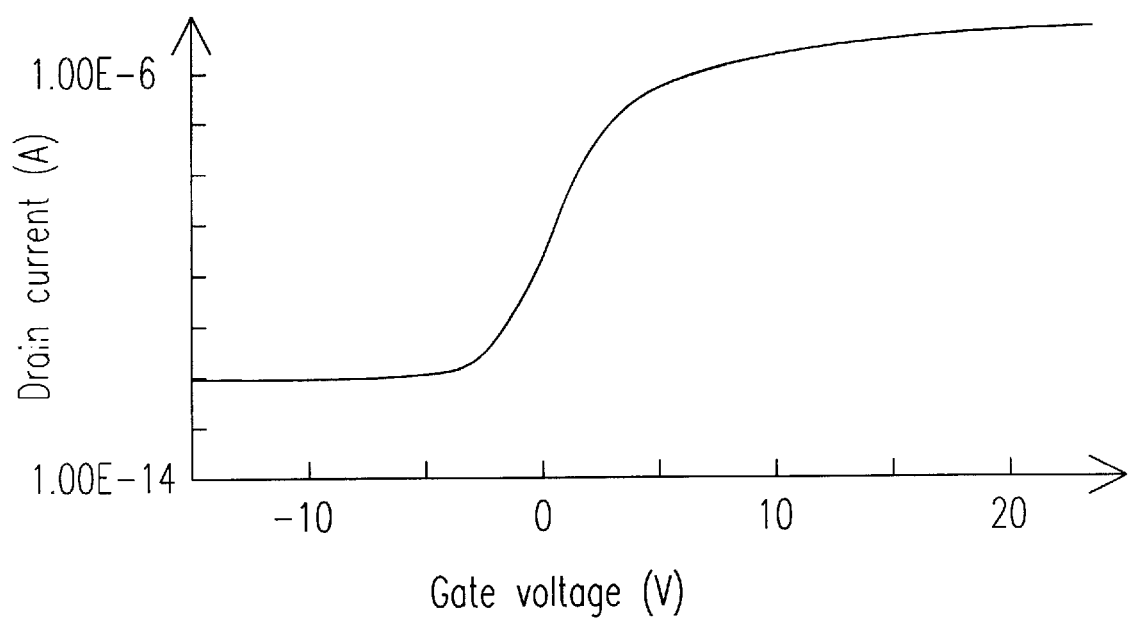
FIG. 8 is a plot illustrating the relation between the drain current and the applied gate voltage of the thin film transistor treated by a gas mixture of hydrogen and nitrogen according to the present invention.

In the third embodiment, a gas mixture of hydrogen and nitrogen is provided during an annealing step at 250° C. for 20 minutes. The relation between the drain current and the applied gate voltage of the thin film transistor for the third embodiment is shown as FIG. 8. Referring to FIG. 8, there is no double hump phenomenon is shown and the sub-threshold swing increases.

Besides providing the specific assistant gas to perform the annealing step of the etching stop thin film transistor, the process according to the present invention can certainly be applied to the back channel etched thin film transistor for improving the output property thereof. Of course, the present invention is not limited to apply in these two basic type of thin film transistor. As long as the annealing step is involved in the process for forming the thin film transistor, the specific assistant gas can be provided for improving the property.

In sum, the present invention discloses an improving process for forming the thin film transistor. After the structure of thin film transistor device is finished, a normal annealing step is proceeded under atmosphere of a specific assistant gas such as hydrogen, steam or the gas mixture of hydrogen and nitrogen. It is not necessary to change the annealing conditions such as temperature and time, and the annealing step can be proceeded in a thermostatic chamber at atmosphere or in a decompression chamber. Therefore, the time spent at the plasma treatment can be saved for shortening the process time of the thin film transistor. In addition, the present invention can improve the output property of the thin film transistor for avoiding double hump phenomenon.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming a thin film transistor, comprising steps of:
   (a) forming a gate on a portion of a substrate;
   (b) forming a gate dielectric layer on said gate and said substrate;
   (c) forming a semiconductor layer on said gate dielectric layer;
   (d) defining a source and a drain on said semiconductor layer;
   (e) forming a passivation on said source, said drain, and said semiconductor layer; and
   (f) proceeding a thermal treatment under atmosphere of a specific assistant gas.

2. The process according to claim 1, wherein said substrate is a transparent substrate.

3. The process according to claim 2, wherein said transparent substrate is a glass substrate.

4. The process according to claim 1, wherein said gate is one of a polysilicon and a metal.

5. The process according to claim 1, wherein said gate dielectric layer is a silicon nitride layer.

6. The process according to claim 1, wherein said semiconductor layer is an amorphous silicon layer.

7. The process according to claim 1, wherein said semiconductor layer is an amorphous silicon layer forming thereon an etching stop layer.

8. The process according to claim 7, wherein said etching stop layer is a silicon nitride layer.

9. The process according to claim 8, wherein said silicon nitride layer is formed by a plasma enhanced chemical vapor deposition.

10. The process according to claim 1, wherein said source and said drain are formed by one of an ion implantation and a plasma enhanced chemical vapor deposition.

11. The process according to claim 1, wherein said passivation is a silicon nitride layer.

12. The process according to claim 1, wherein said specific assistant gas is one selected from a group consisting of hydrogen, steam, inert gases, and gas mixtures thereof.

13. The process according to claim 12, wherein said specific assistant gas is hydrogen and said thermal treatment is performed at a temperature ranged from 200 to 300° C.

14. The process according to claim 12, wherein said specific assistant gas is one selected from a gas mixture of steam and argon and a gas mixture of steam and nitrogen, said steam has a volume ratio ranged from 20 to 100%, and said thermal treatment is performed at a temperature ranged from 80 to 300° C.

15. The process according to claim 12, wherein said specific assistant gas is a gas mixture of hydrogen and nitrogen, and said hydrogen has a volume ratio ranged from 20 to 100% and said thermal treatment is performed at a temperature ranged from 200 to 300° C.

16. The process according to claim 1, wherein said thermal treatment is an annealing step and has a treating time ranging from 10 minutes to 10 hours.

17. The process according to claim 16, wherein said thermal treatment is proceeded at atmosphere.

18. The process according to claim 16, wherein said thermal treatment is proceeded at decompression ranged from 1 to 750 torr.

19. A process for improving a thin film transistor property, wherein said thin film transistor includes a substrate, a gate, a semiconductor layer, a source, a drain, and a passivation, comprising steps of:
   providing a specific assistant gas which is selected from a group consisting of hydrogen, steam, inert gases, and gas mixtures thereof; and
   proceeding a thermal treatment with said thin film transistor at atmosphere of said assistant gas.

20. A process for producing a thin film transistor of a liquid crystal display, comprising steps of:
   (a) forming a gate on a portion of a transparent substrate;
   (b) forming a gate dielectric layer on said gate and said substrate;
   (c) forming a semiconductor layer on said gate dielectric layer;
   (d) defining a source and a drain on said semiconductor layer;
   (e) forming a passivation on said source, said drain, and said semiconductor layer;
   (f) removing a portion of said passivation on said source and said drain for forming a contact window;
   (g) forming a conducting electrode in said contact window; and
   (h) proceeding a thermal treatment under atmosphere of a specific assistant gas.

21. The process according to claim 20, wherein said step (f) is preformed by a dry etching.

22. The process according to claim 20, wherein said step (g) further comprises steps of:
   (g1) forming a conducting layer in said contact window and on said passivation; and
   (g2) removing said conducting layer on said passivation for forming said conducting electrode.

23. The process according to claim 22, wherein said conducting layer is a transparent conducting layer.

24. The process according to claim 23, wherein said transparent conducting layer is an indium-tin oxide layer.

* * * * *